US008044458B2

(12) United States Patent (10) Patent No.: US 8,044,458 B2
Mauder et al. (45) Date of Patent: Oct. 25, 2011

(54) SEMICONDUCTOR DEVICE INCLUDING A VERTICAL GATE ZONE, AND METHOD FOR PRODUCING THE SAME

(75) Inventors: Anton Mauder, Kolbermoor (DE); Hans-Joachim Schulze, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 11/752,590

(22) Filed: May 23, 2007

(65) Prior Publication Data

US 2007/0272978 A1 Nov. 29, 2007

(30) Foreign Application Priority Data

May 23, 2006 (DE) .......................... 10 2006 024 504

(51) Int. Cl.
*H01L 29/94* (2006.01)

(52) U.S. Cl. ..................................... 257/330

(58) Field of Classification Search .......... 257/135–136, 257/242, 329, E29.071, E27.095–E27.096, 257/E29.118, E29.274, 120, 124, 133, 127, 257/146, 153, 175, E27.052, E27.079, E29.036–E29.038, 257/E29.046–E29.048, E29.115, E29.196, 257/E29.211–E29.225, E21.388–E21.393, 257/E21.614, E21.677, 147, E21.41, E21.629, 257/E21.643, E29.027–E29.028, E29.066–E29.067; 257/E29.194–E29.202, E21.382–E21.385, 257/E21.607–E21.613; 438/133, 136, 137, 438/156, 173, 192, 206, 212
See application file for complete search history.

(56) References Cited

U.S. PATENT DOCUMENTS

| 4,893,160 | A | | 1/1990 | Blanchard | |
|---|---|---|---|---|---|
| 5,304,821 | A | * | 4/1994 | Hagino | 257/133 |
| 5,629,543 | A | * | 5/1997 | Hshieh et al. | 257/330 |
| 5,843,796 | A | * | 12/1998 | Disney | 438/133 |
| 6,091,107 | A | * | 7/2000 | Amaratunga et al. | 257/331 |
| 6,137,122 | A | * | 10/2000 | Liaw et al. | 257/132 |
| 6,380,569 | B1 | * | 4/2002 | Chang et al. | 257/256 |
| 6,686,612 | B1 | * | 2/2004 | Horch et al. | 257/133 |
| 7,199,404 | B2 | * | 4/2007 | Ohtani | 257/142 |
| 7,625,793 | B2 | * | 12/2009 | Calafut | 438/212 |
| 2003/0201454 | A1 | * | 10/2003 | Francis et al. | 257/123 |

FOREIGN PATENT DOCUMENTS

| DE | 10005772 | 8/2001 |
|---|---|---|
| DE | 10085054 | 12/2005 |
| WO | 0219434 | 3/2002 |

* cited by examiner

*Primary Examiner* — Dao Nguyen
*Assistant Examiner* — Tram H Nguyen
(74) *Attorney, Agent, or Firm* — Dicke, Billig & Czaja, PLLC

(57) ABSTRACT

A semiconductor device includes a semiconductor body defining a trench structure having walls. A plurality of vertical gate zones each have a gate electrode and a gate oxide that covers the walls of the trench structure. A body zone of a first conduction type is arranged between two of the gate zones and a drift zone of a complementary conduction type with respect to the first conduction type vertically adjoins the body zone. Floating shielding zones of the first conduction type are arranged adjacent to the gate zones and extend into the semiconductor body deeper than the trench structure of the gate zones. A pn junction with the drift zone is below the trench structure. A buried dopant zone of the same charge type as the drift zone has a higher impurity concentration than the drift zone and is arranged in a space charge region of the pn junction at a distance from the trench bottom of the trench structure.

20 Claims, 6 Drawing Sheets

SEMICONDUCTOR DEVICE INCLUDING A VERTICAL GATE ZONE, AND METHOD FOR PRODUCING THE SAME

CROSS-REFERENCE TO RELATED APPLICATIONS

This Utility Patent Application claims priority to German Application No. DE 10 2006 024 504.0, filed May 23, 2006, which is herein incorporated by reference.

BACKGROUND

Aspects of the invention relate to a power semiconductor component including a vertical gate zone, wherein the gate zone is arranged in a trench structure of a semiconductor body. The gate zone has a gate electrode and a gate oxide. In this case, the gate oxide covers the walls of the trench structure. In addition, in the case of the known power semiconductor components including vertical gate zones, a body zone of a first conduction type is arranged between two gate zones, the body zone being adjoined vertically by a drift zone having a second conduction type, which is complementary to the first conduction type. Adjacent to the gate zones and the drift zone, power semiconductor components of this type have floating shielding zones of the first conduction type.

When power semiconductor components of this type are turned off, the voltage across the component rises on account of the ever present leakage inductances of an electronic circuit. The permissible intermediate circuit voltage present in static fashion is significantly exceeded in this case. Such an overvoltage spike is particularly critical in the case of high currents, or high leakage inductances relative to the current. This becomes apparent particularly adversely in the case of IGBT modules (insulated gate bipolar transistor). The turn-off of high currents is particularly problematic in this case, for example in overload situations, such as when starting up electrical appliances or electric motors, or in the case of motor blockades, or in the case of a short circuit in an application, because the current change di/dt and thus the overvoltage spike rise as a result. Further particularly critical cases for known power semiconductor components of the IGBT type are high intermediate circuit voltages such as occur during the decelerating operating mode, for example, because here there is a decrease in the usable voltage reserve with respect to the permissible reverse voltage of the power semiconductor component.

Hitherto, power semiconductor components of this type, as illustrated in FIG. 5, have always been dimensioned with regard to the critical operating case such as, for example, the overvoltage case with the steepest occurring di/dt at the highest intermediate voltage occurring in the application. By virtue of this measure, IGBT power semiconductor components are then turned off in decelerated fashion in such a way that the overvoltage spike still lies in the permissible range. This leads to a slower turn-off and thus to unnecessarily high switching losses in the normal operating mode, in which the decelerated turn-off would not be required at all.

As a result, the driving outlay for known power semiconductor components of this type is in some instances considerable for the customer since significantly more than just a driving transistor and a gate series resistor are required for such driving. For the turn-off from the short-circuit case, another different driving condition than in the normal switching or overload operating mode is usually chosen, which increases the outlay further for the customer. FIGS. 5 and 6 illustrate this problem.

In this respect, FIG. 5 illustrates a schematic cross section through a cell structure of an IGBT power semiconductor component 5 including a vertical gate zone 7 arranged within a trench structure 8 of a power semiconductor chip 23. The power semiconductor chip 23 has a semiconductor body 9 having a top side 31 and an underside 26. The semiconductor body 9 has a field stop zone 24 and a lightly doped semiconductor layer 21, in which a drift path 22 is arranged. The gate zone 7 projects into the drift path 22 and has a gate oxide 11 and a gate electrode 10 identified by G, wherein the gate oxide 11 is arranged on the trench walls 12 of the trench structure 8. A p-conducting body zone 13 is arranged between two gate zones 7, and is electrically connected to a metallic emitter electrode E via a highly doped $p^+$-conducting region 28. The body zone 13 is adjoined vertically by an $n^-$-conducting drift zone 14 leading from an $n^-n$ junction with an n-conducting field stop zone 24, which acts as a field stop junction 29, to a further pn junction 25 of a p-conducting layer 30 on the underside of the semiconductor body 9, which constitutes a rear side emitter ER, wherein a collector electrode C of the IGBT is arranged on the underside 26 of the semiconductor body 9. On account of a field punch-through, the correspondingly weakly doped n-conducting field stop region of the substrate can dynamically supply an additional current during turn-off and thus decelerate the rise in the reverse voltage across the component. However, this capability depends greatly on the intermediate circuit voltage currently present, and therefore does not have a sufficiently large production window since the leakage current or the static reverse voltage likewise suffers from the lightly doped field stop region. Furthermore, the cell structure including emitter region, body zone, gate zone and drift path, in the region near the surface of the semiconductor body 9, is surrounded by a floating p-doped shielding zone 15, wherein the shielding zone 15 extends into the semiconductor body 9 deeper than the trench gate structure.

FIG. 6 illustrates an alternative solution for improving the power semiconductor component characteristic in which the trench structure 8 projects into the semiconductor body by its bottom region 17 deeper than the shielding zones 15. In the case of this power semiconductor component 6 of the IGBT type a robust turn-off behavior is achieved by virtue of the fact that the trench bottom 17 is no longer covered by the floating p-doped shielding zones 15. Rather, here use is made of a dynamic avalanche breakdown effect, also called dynamic avalanche, which occurs at the exposed trench bottoms not covered by floating p-doped shielding zones 15.

Even though a robust turn-off behavior is achieved with this construction, the avalanche effect, avalanche multiplication, nevertheless gives rise, directly at the trench bottom 17, to an injection of hot charge carriers into the oxide 11 of the trench bottom 17, which, independently of the thickness of the oxide 11, leads to a change in the turn-on properties over the course of the lifetime of the power semiconductor component 6, which therefore slowly deteriorate.

Although it might be expected from introducing a deeply extending highly doped $p^+$-conducting region 28 in the center of the p-conducting body zone 13 of a cell, as is illustrated in FIG. 5 and FIG. 6, that the dynamic limiting of the reverse voltage across the component, also called "dynamic clamping" behavior, and the switching robustness will likewise be improved, such a $p^+$-type needle 28 in the p-conducting body zone 13 leads to intensified hole discharge in the on-state case, and thus to significantly reduced flooding at the top side, that is to say to significantly increased on-state losses, primarily if the $p^+$-type needle 28 extends deeper than the p-doped body zone 13 (not illustrated).

For these and other reasons there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
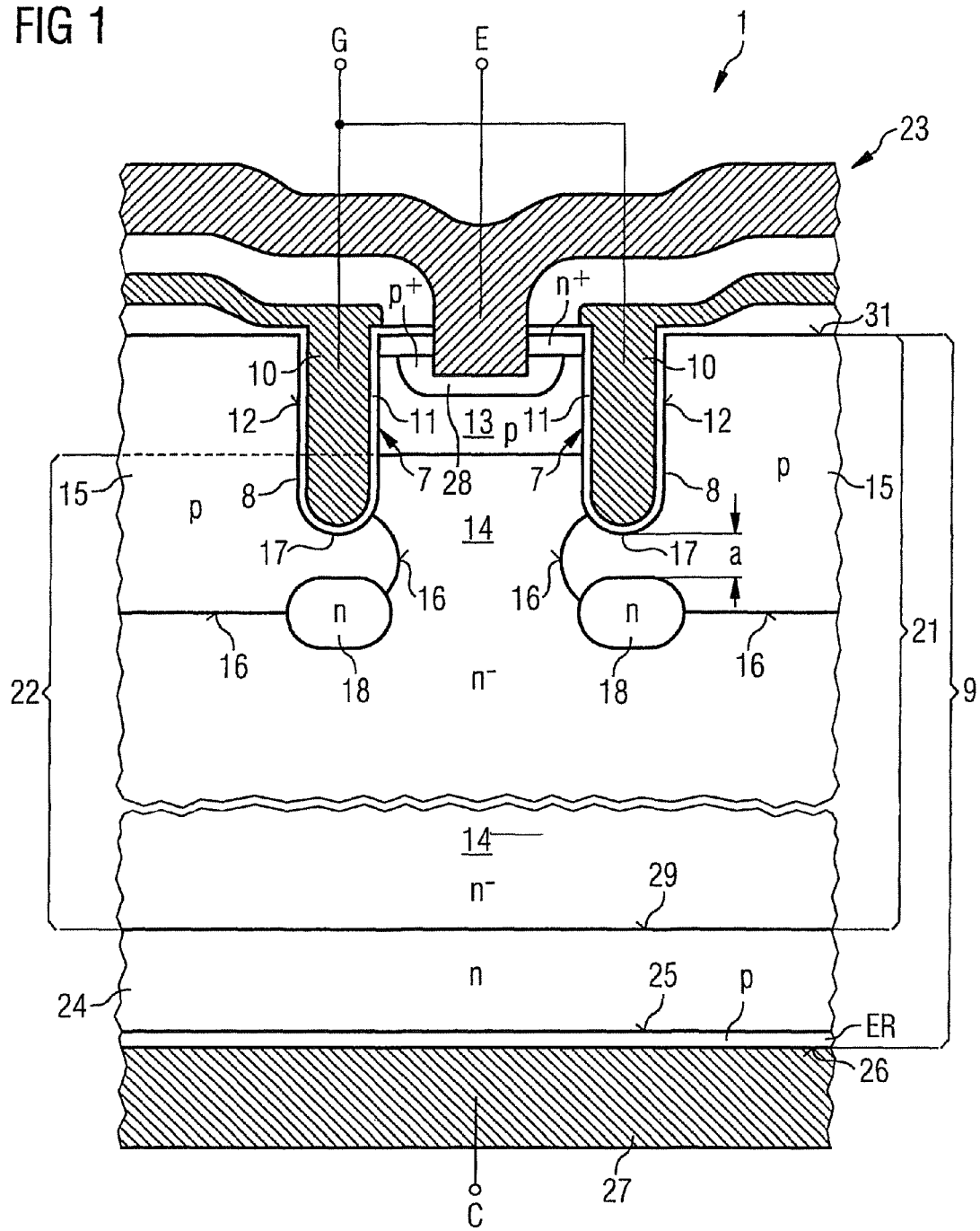
FIG. 1 illustrates a schematic cross section through a cell of a power semiconductor chip of a power semiconductor component 1 of a first embodiment of the invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

To summarize, the hitherto known dimensioning of power semiconductor components leads to increased switching losses and thus to a reduced usability of, for example, IGBT switches and is associated with a considerable outlay in terms of costs and development for the customer, both for driving and for the power section.

Embodiments of the invention overcome the disadvantages in the prior art and in this case take account of the respective loading by leakage inductances during component development. In this case, the aim is to configure the dynamic response of the turn-off behavior such that at customary values of the leakage inductance and the highest rated current in a housing, impermissibly high overvoltages still do not occur.

A power semiconductor component includes vertical gate zones, wherein the gate zones are arranged in a trench structure of a semiconductor body. The gate zones, for their part, have gate electrodes and a gate oxide, which covers the walls of the trench structure. A body zone of a first conduction type is arranged between two gate zones, the body zone being adjoined vertically by a drift zone of a complimentary conduction type with respect to the first conduction type. Shielding zones of the first conduction type are arranged adjacent to the gate zones, the shielding zones extending into the semiconductor body deeper than the trench structure of the gate zones and having a pn junction with the drift zone below the trench structure.

This power semiconductor component has the following advantages. A buried dopant zone of the same charge type as the drift zone is arranged in the space charge region of the pn junction between drift zone and shielding zone at a distance from the trench bottom of the trench structure, and has a higher impurity concentration than the drift zone. Consequently, with this cell structure a dynamic avalanche effect is likewise achieved in the turn-off of the power semiconductor component for active voltage limiting in the cell array. At the same time, the blocking capability of the edge of the power semiconductor component is not reduced further; furthermore, the load current or the avalanche current during turn-off is distributed between a large buried silicon area uniformly below the trench structure and a significantly improved switching robustness of the power semiconductor component is thus ensured, but at the same time hot charge carriers are no longer injected into the oxide in the bottom region of the trench structure by avalanche multiplication. Rather, the avalanche breakdown takes place at the more highly doped n-conducting dopant zones arranged in buried fashion below the trench bottom.

In order to protect the trench bottom and the trench oxide, which covers the trench walls and at the same time constitutes the gate oxide in this embodiment of the invention, against hot charge carriers, a distance a between the n-conducting dopant zone and the bottom region of the trench structure of from 100 nanometers up to a few 100 nanometers is already sufficient, between $100 \text{ nm} \leq a \leq 500 \text{ nm}$. Such a distance can be achieved by an implantation of an additional n-type doping into the trench bottoms with sufficiently high energy since the Bragg deceleration zone for implanted ions, in which a maximum of impurities is incorporated depending on the mass of the dopant in the semiconductor body below the trench bottom, is energy-dependent.

By virtue of the additional n-conducting doping at the boundary in the space charge region between p-conducting shielding zones and n⁻-conducting drift zone, in the case of an established space charge zone according to the structure such as is also illustrated in FIG. 1, a field spike is generated below the trench structure in the region of the trench bottom, which leads to increased occurrence of avalanche multiplication during turn-off as a result of the discharging hole current. This dynamically generated current leads to a retarded turn-off and thus to a voltage limiting which precisely matches the currently prevailing operating situation. Consequently, independently of the leakage inductance and the current that is currently to be turned off, the power semiconductor component is switched off as rapidly as possible and with the least possible turn-off losses. At the same time, an excessively rapid rise in the reverse voltage, which might lead to a local overloading, and hence to power semiconductor component failure, for example in the edge or at the gate electrode, does not occur either.

Figure 6:
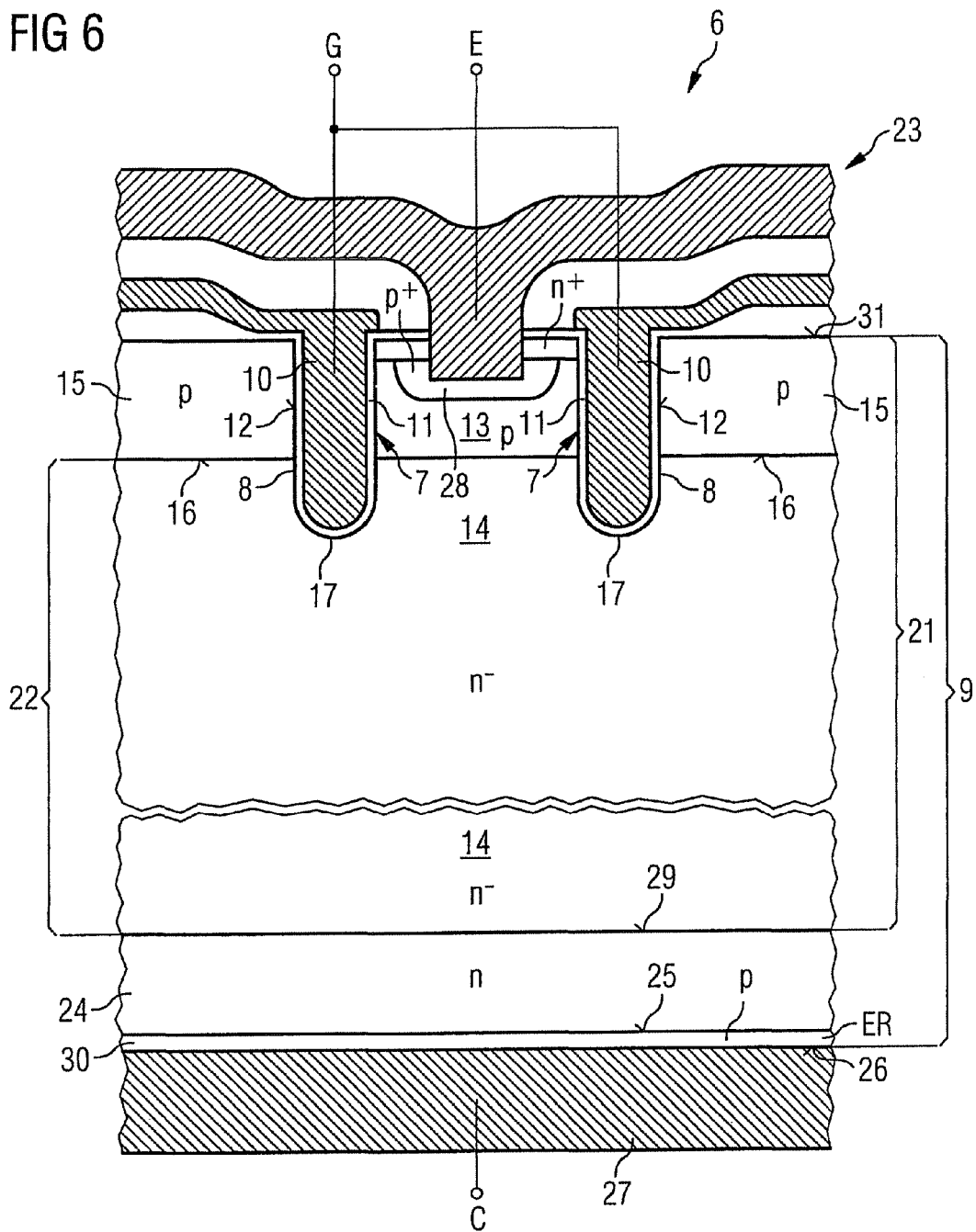
FIG. 6 illustrates a schematic cross section through a cell of a power semiconductor component 6 of a further version in the prior art.

In contrast to the solution illustrated in FIG. 6, the avalanche breakdown does not take place directly at the boundary between semiconductor material and oxide material of the gate structure, but instead centrally in the semiconductor material. It is therefore not possible for any hot charge carriers to be injected into the oxide of the walls of the trench structure, which charge carriers would lead to trapping in the oxide and hence to drift phenomena.

Arsenic atoms are used for these n-type dopant cells since they outdiffuse to a significantly lesser extent than phosphorus atoms, for example, during the subsequent thermal processes. However, phosphorus is also suitable and has the advantage that it is lighter and can therefore be implanted into the semiconductor body deeper below the trench structure. In this case, the dose of the implanted n-type doping at the trench bottom is lower than the breakdown charge. The p-type doping of the shielding zones that is to be compensated for can be taken into account, of course, in the implanted dose of n-conducting impurity material.

Moreover, another p-type doping can additionally be implanted with low energy at the trench bottoms, which doping additionally shields the oxide against loading and the high hole current density that flows. This is achieved by virtue of the fact that the trench structure has a trench bottom which is covered with gate oxide and to which the shielding zone extends into the semiconductor body, wherein the gate oxide in the bottom region of the trench structure is adjoined by a conductive dopant zone within the shielding zone having an increased impurity concentration of the first conduction type, which also prevails in the shielding zone.

Figure 3:
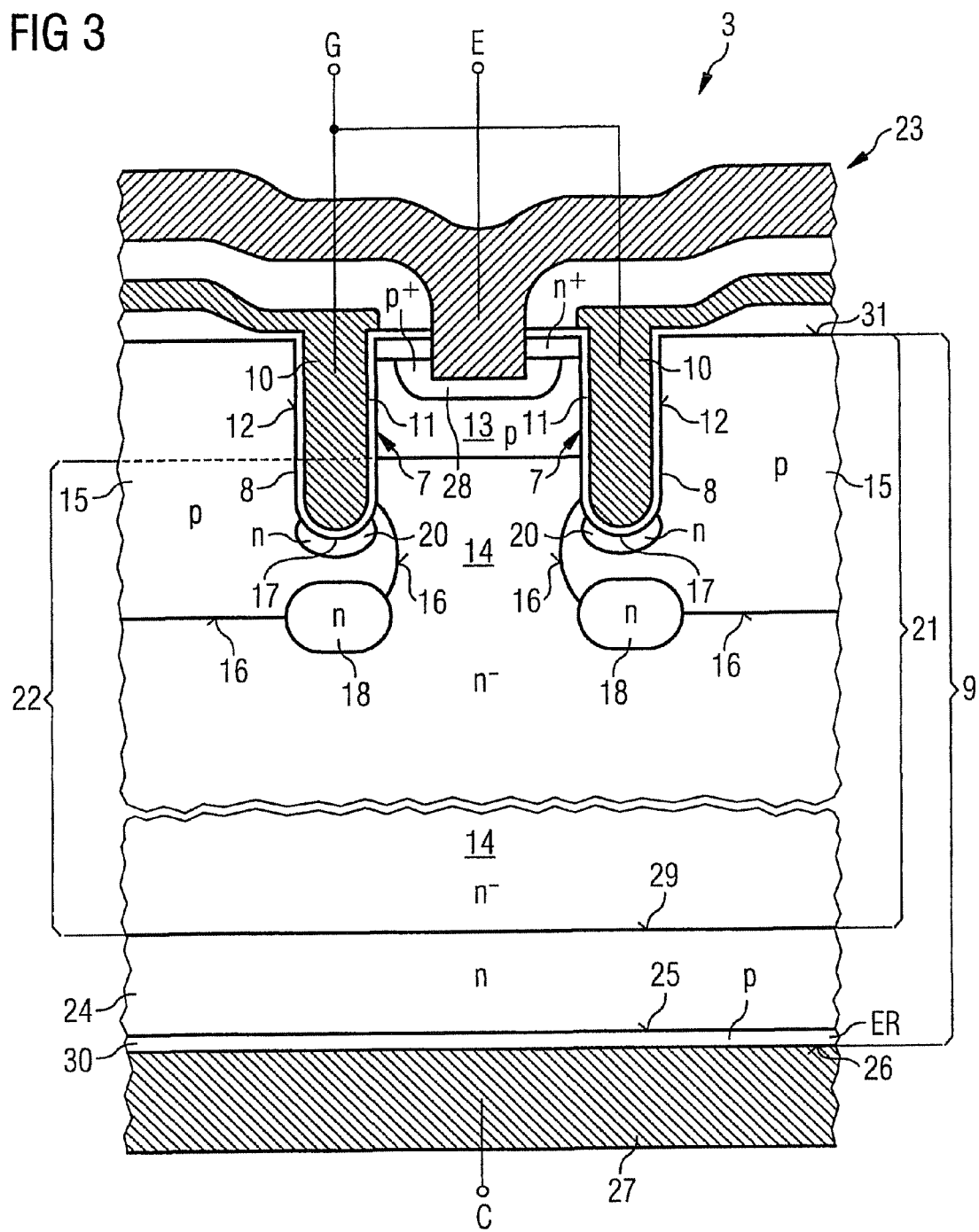
FIG. 3 illustrates a schematic cross section through a cell of a power semiconductor chip of a power semiconductor component 3 of a third embodiment of the invention.

A further variant which provides an additional n-type doping in the region of the trench, is aimed at increasing the turn-on speed and thus at reducing the turn-on losses. For this purpose, there is provided at the gate oxide in the bottom region of the trench structure a complimentarily conductive second dopant zone surrounded by the shielding zone having the first conduction type. In the case of IGBTs with high flooding in comparison with their basic doping, at the beginning of turn-on the drift zone is to be flooded with charge carriers first before the voltage assumes very low values. The turn-on losses of shrunk IGBTs of this type cannot be reduced simply. Therefore, in this further embodiment of the invention, this additional n-type dopant zone is introduced at the trench bottom, as will be explained later with the aid of FIG. 3 and FIG. 4. The dopant zone is either completely surrounded by shielding zones, as illustrated in FIG. 3, or has a contact with the n$^-$-conducting drift zone in the direction of the p-conducting body zone, such that the complimentarily conductive second dopant zone below the trench bottom projects laterally from the shielding zone right into the drift zone.

Figure 4:
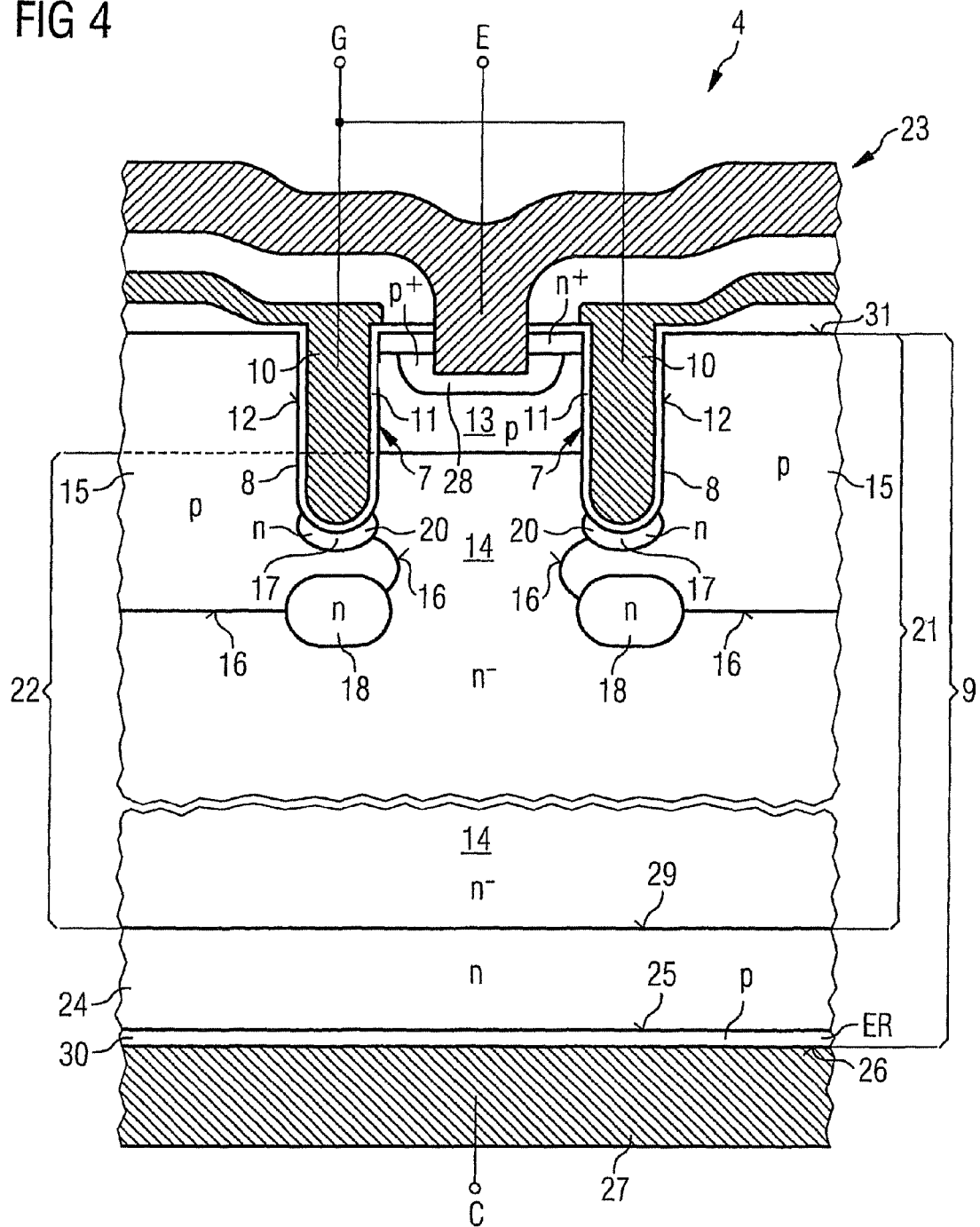
FIG. 4 illustrates a schematic cross section through a cell of a power semiconductor chip of a power semiconductor component 4 of a fourth embodiment of the invention.

This embodiment of the invention has the advantage that during turn-on a channel is formed between n$^+$-type emitter and the additional n-conducting dopant zone at the trench bottom. As a result, the n-type dopant zone is virtually at emitter potential, while the floating p-doped shielding zone is at a higher potential. Electrons are injected from the n-conducting dopant zone into the shielding zone and thus analogously to the effect of an npn transistor into the n$^-$-conducting drift zone. Electrons can therefore also be injected into the drift zone below the trench structure and be conveyed to the rear side emitter, which thereby injects holes more uniformly and thus floods the IGBT more rapidly. In this case, the buried n-doped dopant zone, which enables dynamic limiting of the reverse voltage of the component, can additionally be provided, as illustrated in FIGS. 3 and 4.

The semiconductor body of the power semiconductor component is a silicon single crystal and the gate dielectric includes a thermal silicon oxide. This has the advantage that the silicon oxide can be produced technologically in highly pure form on the trench walls of a monocrystalline silicon body. In addition, it is provided that the complementarily conductive dopant zones below the trench bottom have arsenic atoms at substitutional silicon lattice sites. Since arsenic atoms have a lower diffusion coefficient in the silicon lattice than phosphorus, they are maintained in the dopant zone once the latter has been doped, relatively unchanged during the subsequent high-temperature processes. In this case, it is advantageous that it is possible to comply with keeping the net impurity doping of the arsenic atoms in the dopant zone at a distance from the trench bottom lower than the breakdown charge.

Furthermore, in one embodiment of the invention, the gate electrode does not have any metal, but rather a highly doped, polycrystalline silicon. This has the advantage that it likewise retains its position during subsequent high-temperature processes and does not diffuse into the gate oxide or form recombination centers in the gate oxide in the form of traps.

The power semiconductor component is an IGBT switch and is used for converter modules having rated voltages of typically 500 V to 6500 V.

A method for producing a plurality of power semiconductor components including dopant zones, at a distance from a vertical trench structure including gate zones, has the following method processes. The first process involves producing a semiconductor wafer with a multiplicity of semiconductor chip positions which are arranged in rows and columns and in which are arranged drift paths having a complimentary conduction type with respect to body zones and shielding zones having the same conduction type as the body zones. There is introduced into this lightly doped drift zone region a trench structure for vertical gate zones between the drift zones and the shielding zones.

Construction of the trench structure can be followed by an ion implantation—masked as required—of dopants through the trench bottom of the trench structure for dopant zones that are at a distance from the trench bottom and have a complementary conduction type with respect to the shielding zones in the region of the pn junction between drift zones and shielding zones. The power semiconductor component structure is then completed in the semiconductor chip positions, and finally again the semiconductor wafer is separated into individual power semiconductor chips. Finally, the power semiconductor chips are subjected to packaging and external contact formation to form individual power semiconductor components.

This method has the advantage that intermediate stages, such as the introduction of a trench structure, which is necessary for a power semiconductor component including a vertical trench zone, can be used in order to produce the additional buried dopant zones according to the invention below the trench bottom by using ion implantation without additional photoresist masks being required. It is advantageous, moreover, if the edge region of the respective semiconductor chip positions on the semiconductor wafer is protected against penetration of the impurities that are required for the dopant zones, in order that the dielectric strength of the edge zones is not decreased from the outset.

As dopant for the dopant zones, arsenic ions are implanted through the trench bottom into the semiconductor body.

If two dopant zones are implanted, a first dopant zone can be introduced into the semiconductor body at a distance from the trench bottom and a second dopant zone can be arranged directly at the trench bottom by using lower ion implantation energy. In this case, too, the state of the semiconductor wafer with a prepared trench structure can be used in order to introduce these two dopant zones using two implantation processes. If the dopant zone in direct proximity to the trench bottom is intended to have the doping of the shielding zones, then boron is implanted. If, by contrast, the dopant zone at the trench bottom is intended to correspond to the dopant of the drift zones, then arsenic is implanted and phosphorus is possibly used for a second and thus deeper dopant zone. In this case, in one implementation of the method, the same implantation energy can be used for both dopants, especially as phosphorus penetrates into the crystal deeper than arsenic on account of the smaller atomic mass.

Consequently, it is advantageous, in the fabrication sequence, to carry out the n-type implantation after the shielding zone diffusion and after a thermal oxidation process, in which case the sacrificial oxide grown may simultaneously serve as a screen oxide. The implantation is then followed by the sacrificial oxide etch and the cell process for completing the IGBT structure. The dose of the n-type implantation is so low that no adverse effects are to be expected in the region of the cell and the shielding zones outside the trench bottoms since this dose is readily overcompensated for. It is advantageous, however, if the edge of the semiconductor chip positions is also provided with the trench mask and protected in order that no n-type implantation into the edge structure of the semiconductor chips takes place.

However, an additional photolithography process may also be required, such that it is expedient to shield the outermost series of cells adjoining the edge from the n-type implantation for the dopant zones in order to protect this region against the additional avalanche loading. At the transition to the edge termination, the discharging hole current densities are particularly high during turn-off, which would likewise lead to an earlier commencement of the dynamic avalanche and should therefore be avoided by protecting the edges.

In one exemplary implementation of the method, in order to produce a semiconductor wafer having semiconductor chips arranged in rows and columns, firstly a monocrystalline silicon wafer is provided. The silicon wafer has the dopant concentration of the drift zones. However, it has a multiple thickness of the drift zones and is therefore thinned by grinding virtually to the thickness of the drift zones after completion of the semiconductor chip structures on the top side of the semiconductor wafer. A dopant concentration that is at least one power of ten higher than the drift zone doping is introduced into the semiconductor body from the rear side that has been thinned by grinding, in order to form an ohmic emitter rear side contact.

An alternative possibility for producing a semiconductor wafer having semiconductor chips arranged in rows and columns consists in providing a monocrystalline semiconductor wafer which is doped more highly by at least one power of ten than the drift zones to be formed. An epitaxial layer having the dopant concentration of the drift zones and at least the thickness of the drift zones is deposited on the semiconductor wafer. The trench structure for the gate electrodes can then be worked into the epitaxial layer.

The invention will now be explained in more detail with reference to the accompanying Figures.

Figure 5:
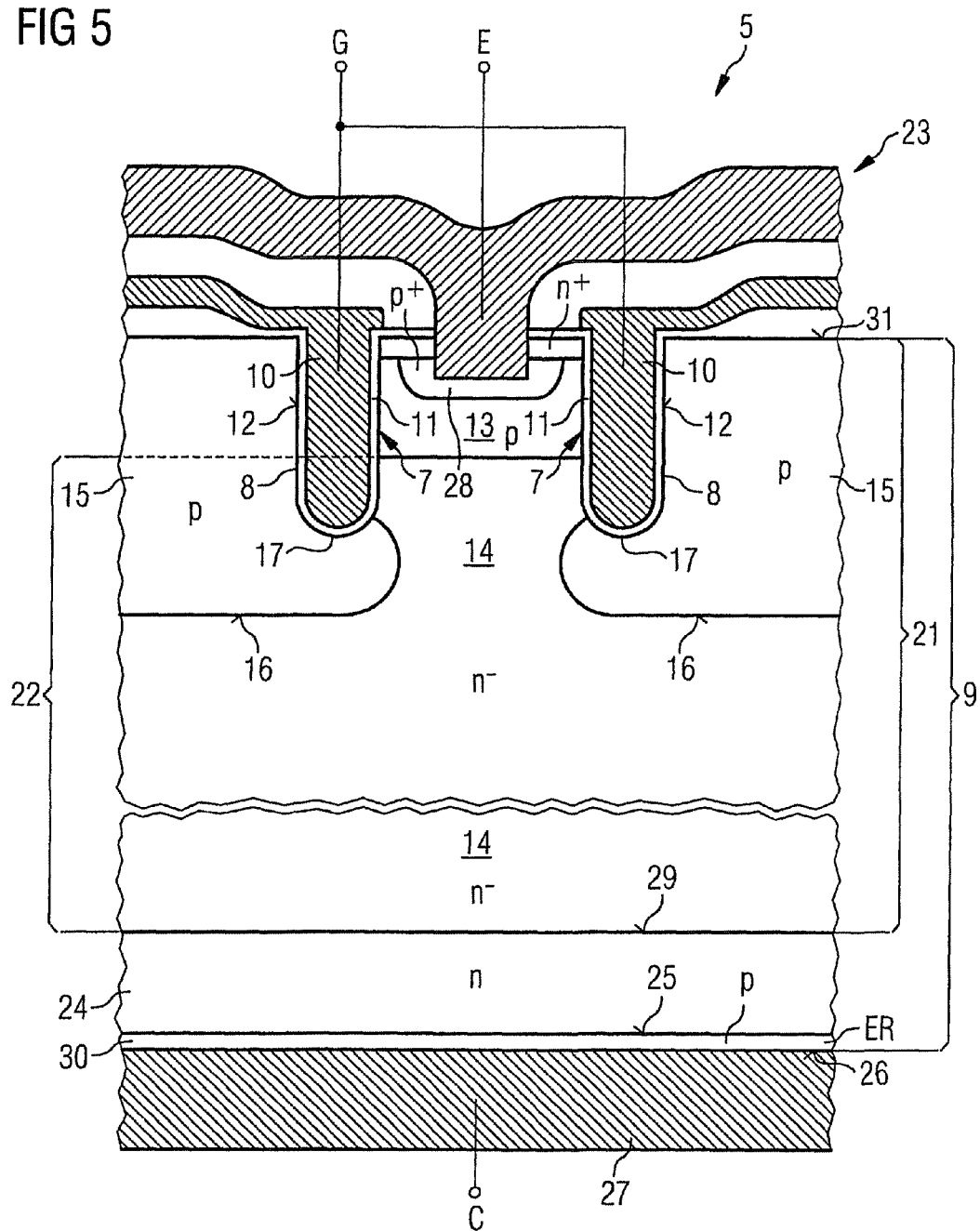
FIG. 5 illustrates a schematic cross section through a cell of a power semiconductor chip of a power semiconductor component 5 in accordance with a first version in the prior art.

FIG. 1 illustrates a schematic cross section through a cell of a power semiconductor chip 23 of a power semiconductor component 1 of a first embodiment of the invention. The construction of the cell corresponds in terms of construction to the cell in accordance with the prior art such as is illustrated by FIG. 5. Component parts having the same functions as in FIG. 5 are identified by the same reference symbols in FIGS. 1 to 4 and are not discussed separately.

In accordance with embodiments of the invention, a dopant zone 18 is arranged within the space charge zone of the pn junction 16 between the shielding zone 15 and the drift zone 14 below the vertical trench structure 8 including gate zones 7, and there in particular below the trench bottom 17, the dopant zone being n-conducting and having a higher impurity doping than the n⁻-conducting drift path 14.

By virtue of the higher impurity concentration in the dopant zone 18, in the event of overvoltage spikes in the switch-off phase of this power semiconductor component 1 having the structure of the power semiconductor component 5 of the prior art as illustrated in FIG. 5, avalanche breakdowns are brought about in the case of overvoltage and they enable a safeguarded switch-over to the off-state case and simultaneously keep the switch-over losses low. Moreover, the avalanche breakdowns are arranged remote from the trench structure in the region of the dopant zone 18 introduced in buried fashion, such that no hot charge carriers can be injected into the oxide 11 of the trench structure 8 and the oxide 11 of the trench structure 8 is thus protected. A distance a of a few 100 nanometers from the trench bottom 17 already suffices for this purpose.

Figure 2:
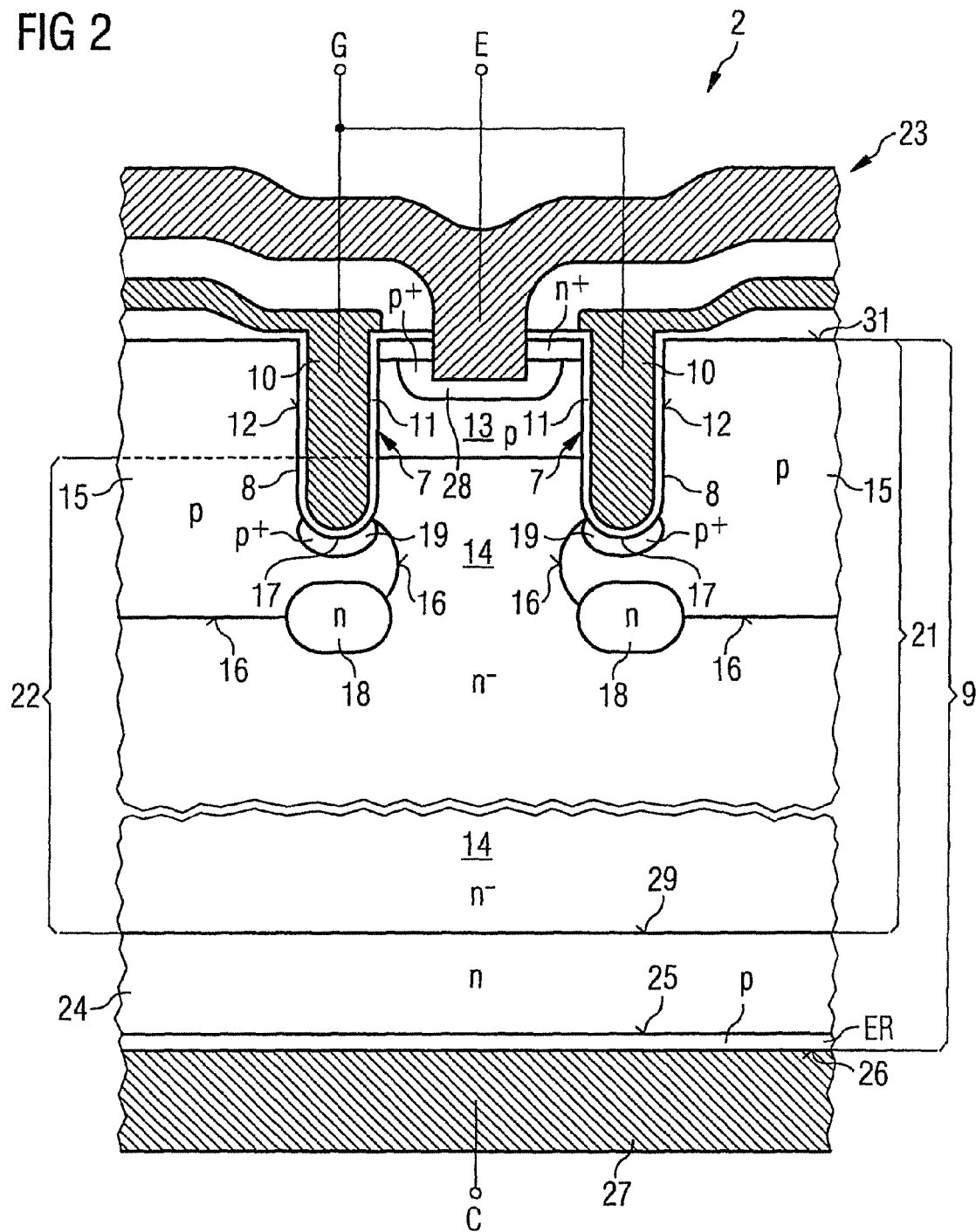
FIG. 2 illustrates a schematic cross section through a cell of a power semiconductor chip of a power semiconductor component 2 of a second embodiment of the invention.

FIG. 2 illustrates a schematic cross section through a cell of a power semiconductor chip 23 of a power semiconductor component 2 of a second embodiment of the invention. In the case of this second embodiment of the invention, an additional second dopant zone 19 is arranged in the region of the trench bottom 17 by using ion implantation, in which case, in this second embodiment of the invention, the same conduction type as prevails in the shielding zone 15 is implanted. This p-conducting dopant zone 19 additionally protects the oxide 11 of the trench structure 8 and shields it from the penetration of hot electrons.

FIG. 3 illustrates a schematic cross section through a cell of a power semiconductor chip 23 of a power semiconductor component 3 of a third embodiment of the invention. In this case, a dopant zone 20 was introduced in the region of the bottom 17 of the trench structure 8, the dopant zone having the same conduction type as the drift zone 14. In addition, a buried n-conducting dopant zone 18 is arranged at a distance from the trench bottom 17 in the semiconductor body 9, and serves for reducing voltage spikes during switch-over through avalanche effects.

When the power semiconductor component is turned on, the additional n-type doping at the trench bottom of the dopant zone 17 has the effect that a channel is formed between the n⁺-type emitter region and the additional n-type doping at the trench bottom. As a result, the n-type doping of the dopant zone is virtually at emitter potential, while the shielding zone 15 is at a higher potential. Electrons are injected from the n-type dopant zone 18 into the shielding zone 15 and into the n⁻-type drift zone 14 analogously to a mode of operation of an npn transistor. Consequently, electrons can be injected into the drift zone 14 below the trench structure 8, and be conveyed to the rear side emitter ER, which thereby injects holes more uniformly and thus floods the IGBT more rapidly.

FIG. 4 illustrates a schematic cross section through a cell of a power semiconductor chip 23 of a power semiconductor component 4 of a fourth embodiment of the invention. The difference between the fourth embodiment of the invention and the third embodiment of the invention is that the n-conducting dopant zone 20 in the region of the trench bottom 17 projects laterally from the shielding zone 15 into the drift path 14. This means that an improved turn-on behavior of the power semiconductor component is likewise achieved, and at the same time the provision of the buried dopant zone 18 results in an improvement of the dynamic latching behavior and the switching robustness of the IGBT illustrated by introduction of a field spike below the trench structure in the silicon at a distance from an oxide boundary layer by using an additional n-type doping.

FIGS. 5 and 6 illustrate embodiments which are known from the prior art. FIGS. 4 and 5 will not be discussed again in order to avoid repetition.

The semiconductor components are typically packaged in power semiconductor modules and used for converter applications.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device, comprising:
   a semiconductor body defining a trench structure having walls;
   a plurality of vertical gate zones each having a gate electrode and a gate oxide that covers the walls of the trench structure;
   a body zone of a first conduction type arranged between two of the gate zones;
   a drift zone of a complementary conduction type with respect to the first conduction type vertically adjoining the body zone;
   floating shielding zones of the first conduction type arranged adjacent to the gate zones, the shielding zones extending into the semiconductor body deeper than the trench structure of the gate zones and having a pn junction with the drift zone below the trench structure; and
   a buried dopant zone of the same charge type as the drift zone having a higher impurity concentration than the drift zone arranged in a space charge region of the pn junction at a distance from the trench bottom of the trench structure.

2. The semiconductor device of claim 1, wherein the trench structure has a trench bottom that is covered with gate oxide and to which the shielding zone extends into the semiconductor body, wherein the gate oxide in the bottom region of the trench structure is adjoined by a conductive dopant zone within the shielding zone having an increased impurity concentration of the first conduction type.

3. The semiconductor device of claim 2, wherein the gate oxide in the bottom region of the trench structure is adjoined by a complementarily conductive second dopant zone surrounded by the shielding zone of the first conduction type.

4. The semiconductor device of claim 1, wherein the distance a between the shielding zones and the gate zones is between 100 nm≦a≦500 nm.

5. The semiconductor device of claim 1, wherein the complementarily conductive second dopant zone below the trench bottom projects from the shielding zone into the drift zone.

6. The semiconductor device of claim 1, wherein the semiconductor body is composed of monocrystalline silicon and the gate oxide is a thermal silicon oxide.

7. The semiconductor device of claim 1, wherein the complementarily conductive dopant zones below the trench bottom have arsenic atoms at substitutional silicon lattice sites.

8. The semiconductor device of claim 7, wherein the dose of the net impurity doping with arsenic atoms in the dopant zone at a distance from the trench bottom is lower than the breakdown charge.

9. The semiconductor device of claim 1, wherein the semiconductor device is an IGBT (insulated gate bipolar transistor) switch.

10. A method for producing a semiconductor device, comprising:
    providing a semiconductor wafer with a multiplicity of semiconductor chip positions arranged in rows and columns and in which are arranged drift paths having a complementary conduction type with respect to body zones and floating shielding zones having the same conduction type as the body zones;
    introducing a trench structure for vertical gate zones between the drift zones and the shielding zones;
    ion implantation of dopants through a trench bottom of the trench structure for dopant zones that are at a distance from the trench bottom and have a complementary conduction type with respect to the shielding zones in the region of the pn junction between drift zones and shielding zones.

11. The method of claim 10, wherein arsenic ions are implanted as dopant.

12. The method of claim 10, wherein two dopant zones are implanted, wherein a first dopant zone is introduced into the semiconductor body at a distance from the trench bottom and a second dopant zone is arranged at the trench bottom by means of lower implantation energy.

13. The method of claim 10, wherein a dopant of the shielding zone is used as dopant of the second dopant zone.

14. The method of claim 13, wherein boron is used as dopant of the second dopant zone.

15. The method of claim 13, wherein a dopant of the drift zone is used as dopant of the first and/or second dopant zone.

16. The method of claim 15, wherein arsenic or phosphorus is used as dopant of the first and/or second dopant zone.

17. The method of claim 13, wherein phosphorus is used as dopant of the first dopant zone at a distance from the trench bottom, and arsenic is used as dopant of the second dopant zone.

18. The method of claim 10, wherein
    a monocrystalline silicon wafer is provided which has the dopant concentration of the drift zones;
    wherein the semiconductor wafer, after the completion of the semiconductor chip structures with trench structures for the gate electrodes is thinned by grinding virtually to the thickness of the drift zones and is doped more highly than the drift zone by means of an emitter rear side diffusion from the ground rear side, with the result that an ohmic emitter rear side contact can reliably be applied.

19. The method of claim 10, wherein a monocrystalline silicon wafer is provided which is doped more highly by at least one power of 10 than the drift zones and on which an epitaxial layer with the thickness of the drift zones and having the dopant concentration of the drift zones is applied prior to the introduction of the trench structure for the gate electrodes.

20. The method of claim 10, further comprising separating the semiconductor wafer into individual semiconductor chips.

* * * * *